United States Patent
Sun et al.

(10) Patent No.: US 6,706,202 B1
(45) Date of Patent: Mar. 16, 2004

(54) METHOD FOR SHAPED OPTICAL MEMS COMPONENTS WITH STRESSED THIN FILMS

(75) Inventors: Decai Sun, Los Altos, CA (US); Michel A. Rosa, San Jose, CA (US); Eric Peeters, Fremont, CA (US); Francesco Lemmi, Rome (IT); Patrick Y. Maeda, Mountain View, CA (US); Christopher L. Chua, San Jose, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/672,386

(22) Filed: Sep. 28, 2000

(51) Int. Cl.[7] ............................................... B81B 7/02
(52) U.S. Cl. ............................. 216/24; 216/26; 216/40
(58) Field of Search ................................ 216/2, 24, 26, 216/40; 427/162

(56) References Cited

U.S. PATENT DOCUMENTS

| | | | | |
|---|---|---|---|---|
| 5,750,417 A | * | 5/1998 | Nellissen | 250/492.22 |
| 6,268,948 B1 | * | 7/2001 | Gelbart | 200/181 |
| 6,299,462 B1 | * | 10/2001 | Biegelsen | 250/216 |
| 6,300,619 B1 | * | 10/2001 | Aksyuk et al. | 359/223 |
| 6,318,871 B1 | * | 11/2001 | Hagelin | 257/415 |
| 6,362,512 B1 | * | 3/2002 | Kubby et al. | 310/309 |
| 2001/0048265 A1 | * | 12/2001 | Miller et al. | 372/50 |
| 2001/0055119 A1 | * | 12/2001 | Wood et al. | 356/519 |
| 2002/0031155 A1 | * | 3/2002 | Tayebati et al. | 372/50 |

OTHER PUBLICATIONS

S. Wolf and R.N. Tauber, Silicon Processing for the VLSI Era, vol. 1, 1986, p. 535.*

* cited by examiner

Primary Examiner—Shrive P. Beck
Assistant Examiner—Allan Olsen (57) ABSTRACT

A method is disclosed for making shaped optical moems components with stressed thin films. In particular, stressed thin films are used to make mirror structures.

10 Claims, 15 Drawing Sheets

METHOD FOR SHAPED OPTICAL MEMS COMPONENTS WITH STRESSED THIN FILMS

BACKGROUND

Passive optical components can play an important role in the refinement and optimization of an optical signal in the MEMS/MOEMS (micro-electromechanical systems/micro-opto-electromechanical) regime. Passive optical devices are often used to control the qualitative properties of light in printing, laser scanning operations or data communications where optical signals are modulated and optical mode quality is integral to system performance. Hence, there is a need to provide passive optical devices for use in optical MEMS/MOEMS systems.

SUMMARY

Stress control in MEMS (micro-electromechanical systems) is important since uncontrolled stress may cause a MEMS component to bow or buckle. However, the ability to control stress in a MEMS context can be used to desirable effect. Stress gradient materials may be used to make three dimensional structures utilizing controlled stress release. Controlled stress in thin films can be used to accurately shape the optical surface of MEMS components. For example, tensile or stress gradient materials can be used to make cylindrical and spherical MEMS mirrors as well as tunable MEMS blaze gratings for use in the MEMS/MOEMS regime. Applications include the areas of optical communications, beam scanning and optical spectroscopy.

DETAILED DESCRIPTION

Figure 1A:
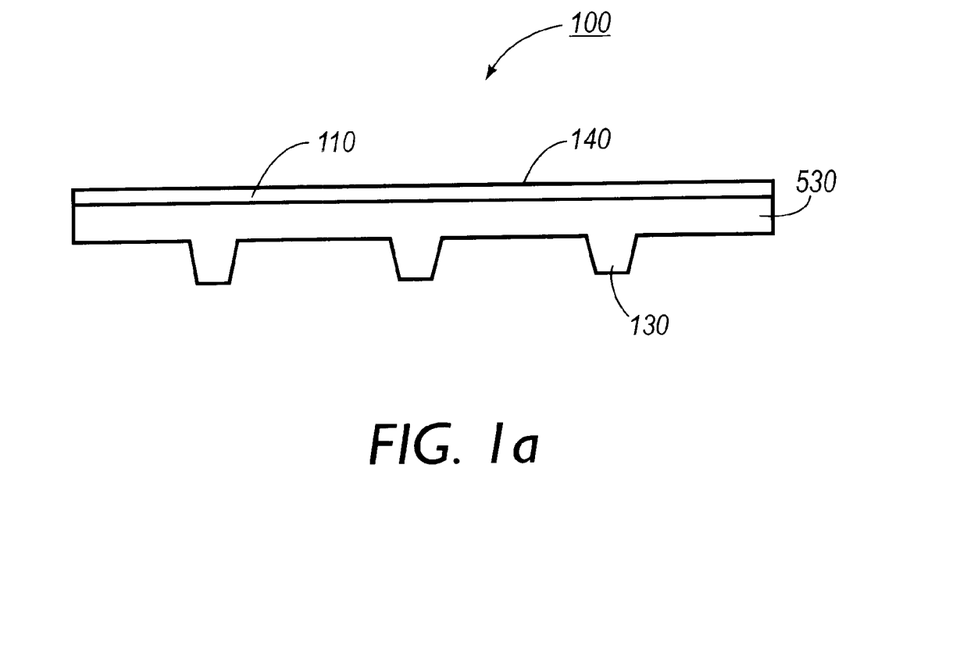
FIG. 1a shows an embodiment of a cylindrical MEMS mirror in accordance with the invention.
Figure 1B:
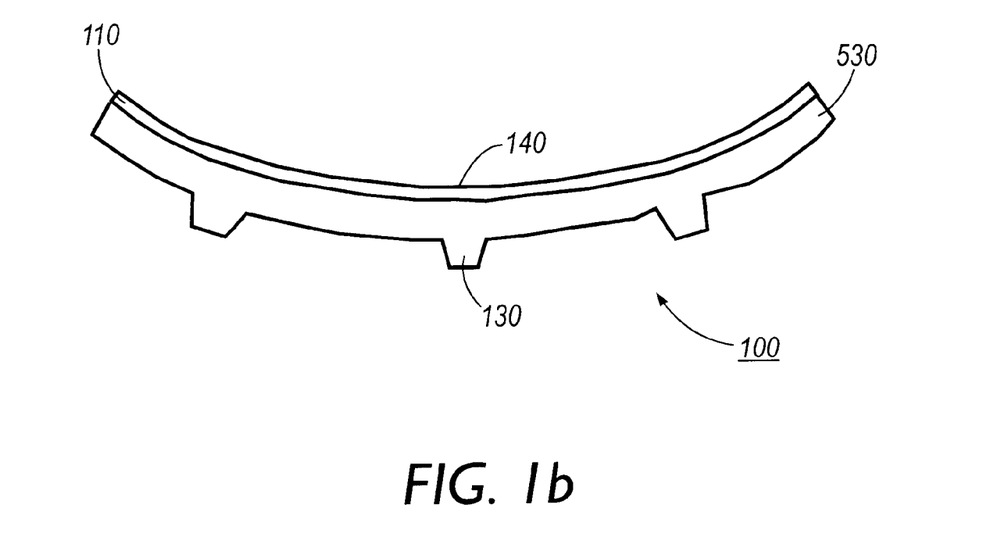
FIG. 1b shows an embodiment of a cylindrical MEMS mirror in accordance with the invention.

Cylindrical reflection mirrors can be used for focusing diffused light into a line for applications such as optical communications. FIGS. 1a and 1b show an embodiment in accordance with the invention of a MEMS structure for cylindrical reflection mirror 100. Conventional surface MEMS design and fabrication including polysilicon deposition and etching or silicon-on-insulator wafer material together with conventional lithography steps for pattern definition may be used for making cylindrical reflection mirror 100.

Stress gradient layer 110 typically has a thickness of from about 500 nm to 1000 nm and is typically made of MoCr which is deposited as described in Table 1 below. Stress gradient layer 110 is deposited on top of structural layer 530 which is, for example, either polysilicon or a single crystal device layer if silicon-on-insulator wafer material is used. Stress gradient layer 110 has a built in stress gradient in the thickness direction varying from compressive on one side of layer 110 to tensile on the other side of layer 110 next to structural layer 530. The stress gradient can be as large as 3.0 Gpa or more. After structure layer 530 is released from substrate 510 (see FIG. 5), the stress gradient in stress gradient layer 110 causes released structure layer 530 to bend.

Reinforcing beams 130 parallel to a common axis and spaced about 40 μm apart are present underneath structure layer 530 to prevent cylindrical reflection mirror 100 from bending in the direction perpendicular to the common axis. Typical dimensions for reinforcing beams 130 are a width of about 10 μm and a height of no more than about 5 μm. Typical dimensions for cylindrical reflection mirror 100 are about 200 mm by 250 mm.

Reflective layer 140, typically of aluminum or gold, is deposited on top of stress gradient layer 110 to a thickness of about 200–500 nm by either thermal deposition or RF sputtering techniques in order to enhance the optical reflection characteristics of cylindrical reflection mirror 100. Cylindrical reflection mirror 100 flatness is achieved by chemical and mechanical polishing structural layer 530 prior to deposition of stress gradient layer 110 and reflective layer 140. Note that polishing is not needed if an SOI wafer is used. The curvature of cylindrical reflection mirror 100 is determined by the stress gradient in stress gradient layer 110 and the thickness of structural layer 530. Increasing the stress gradient in stress gradient layer 110 and decreasing the thickness of structural layer 530 increases the curvature of cylindrical reflection mirror 100. A typical thickness for structural layer 530 is about 100 nm to provide the mechanical support required while still avoiding the transfer of stress in structural layer 530 to cylindrical reflection mirror 100 which occurs if structural layer 530 is thinner than about 100 nm. If structural layer 530 is thinner than about 100 nm, an unacceptable level of anisotropic stress is present in cylindrical reflection mirror 100. For a thickness above about 100 nm and below 500 nm anisotropic stress is not significant and the added thickness still allows for adequate bending of cylindrical reflection mirror 100.

Figure 2:
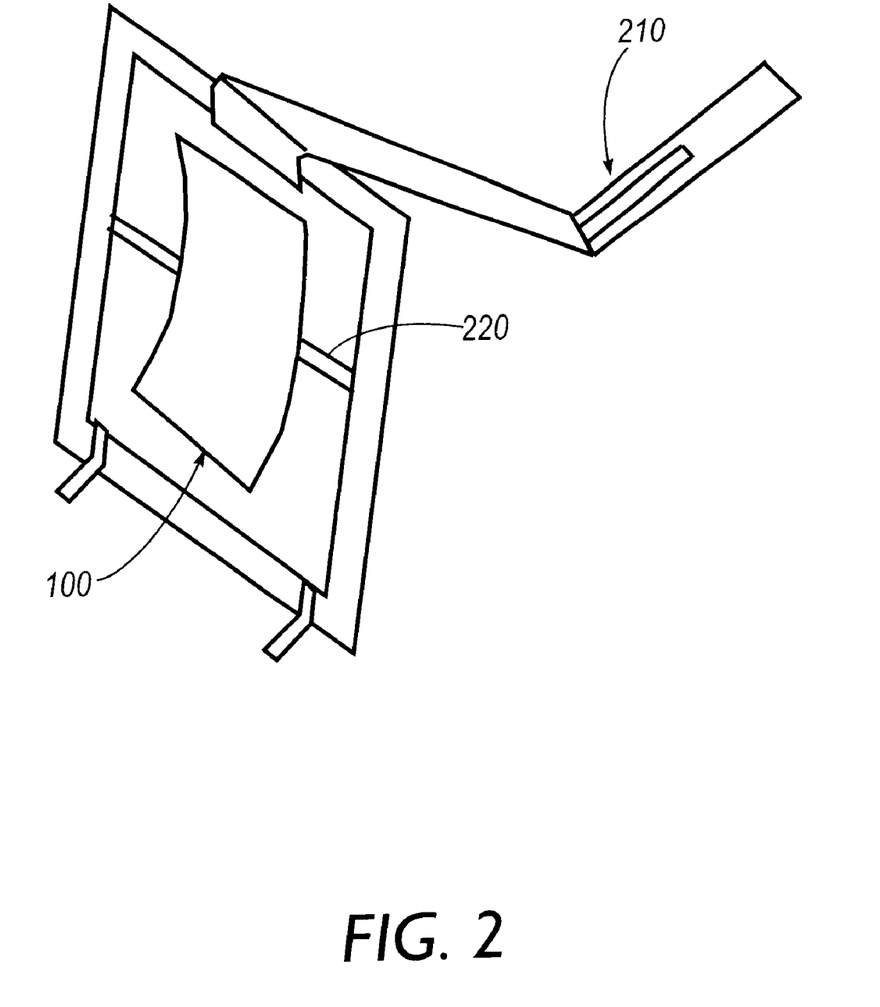
FIG. 2 shows an embodiment of a cylindrical MEMS mirror in accordance with the invention.

An embodiment in accordance with the invention of cylindrical reflection mirror 100 is shown in FIG. 2. Cylindrical reflection mirror 100 is supported by torsion bar 220. The angular position of cylindrical reflection mirror 100 is adjustable with sliding actuator 210 or an electrostatically driven comb drive actuator (not shown) such as described by M. J. Daneman et al. in "Linear Microvibromotor for Positioning Optical Components", IEEE J. MEMs, vol. 5, no. 3, September 1996, pp. 159–165 which is incorporated by reference in its entirety.

Figure 3A:
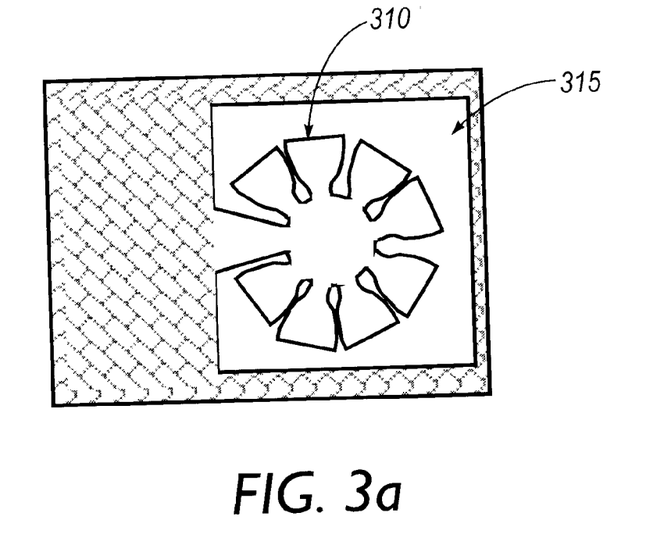
FIG. 3a shows a metal pattern for a spherical MEMS mirror in an embodiment in accordance with the invention.
Figure 3B:
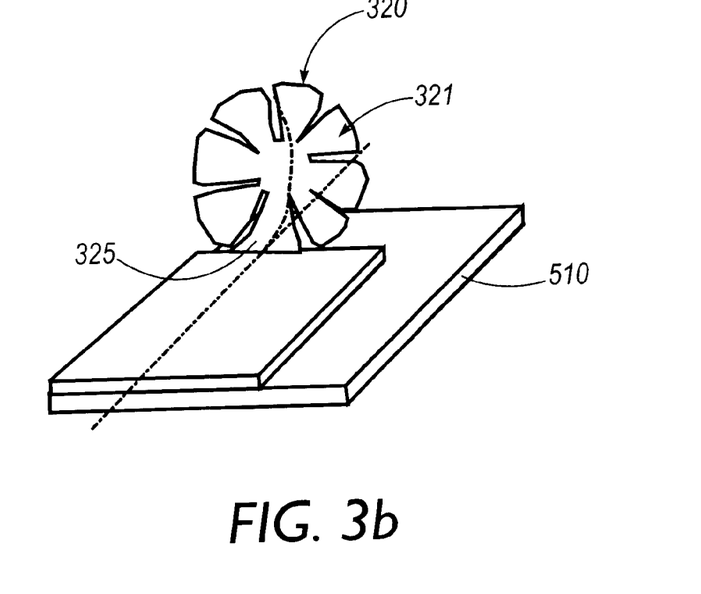
FIG. 3b shows an embodiment of a spherical MEMS mirror in accordance with the invention.

A MEMS spherical mirror can focus light in two dimensions and is desirable for applications such as, for example, beam scanning or optical spectroscopy where a focused beam of light increases the light intensity for optimum results. The ability to control the stress of a metal thin film results in a semi-spherical reflecting surface. Stress gradient layer 110, typically MoCr, with a controlled stress gradient is deposited on substrate 510 coated with sacrificial layer 520 (see FIG. 7b). In an embodiment in accordance with the invention, FIG. 3a shows metal pattern 310 for spherical mirror 320 and release window 315, typically having dimensions of about 400 μm by 400 μm. FIG. 3b shows spherical mirror 320 upon release from substrate 510 typically having a radial extent of about 175 μm. The surface of spherical mirror 320 is typically coated with an aluminum or gold reflective layer by either thermal deposition or RF sputtering techniques. Sacrificial layer 520 is etched through release window 315 to allow release and lift of metal pattern 310 to form spherical mirror 320. Single cantilever 325 anchors spherical mirror 320 to substrate 510. After release, metal pattern 310 (see FIG. 3a) will conform to a spherical surface in the presence of biaxial stress.

The total lift and resulting radius of curvature can be designed using conventional micro-spring design recipes such as disclosed in U.S. Pat. No. 5,914,218 which is incorporated by reference in its entirety. For example, sputter conditions for forming stress gradient layer 110 for pattern 310 in MoCr with a thickness of about 500 nm and with an internal stress gradient of about 3.0 Gpa are as shown in Table 1 below.

TABLE 1

| Sputter Deposition Conditions | Time (sec) |
|---|---|
| Pressure: 1.6 mT<br>Voltage: 518 volts<br>Current: 1.13 A | 390 |
| Pressure: 2.2 mT<br>Voltage: 470 volts<br>Current: 1.26 A | 330 |
| Pressure: 3.0 mT<br>Voltage: 457 volts<br>Current: 1.30 A | 300 |
| Pressure: 3.9 mT<br>Voltage: 453 volts<br>Current: 1.31 A | 330 |
| Pressure: 5.0 mT<br>Voltage: 457 volts<br>Current: 1.30 A | 300 |

Sputter conditions for stress gradient layer 110 for cylindrical mirror 100 and tunable blazed grating membrane structure 410 are also described by Table 1.

If the lift is such that single cantilever 325 is raised above substrate 390 on the order of a few tens of microns, spherical mirror 320 can be electrostatically actuated using a metal contact (not shown) buried under sacrificial layer 520 (see FIG. 7c) below cantilever 325 of spherical mirror 320. Electrostatic actuation allows precise adjustment of the cantilever angle and the option of removing spherical mirror 320 out of the optical path in applications where light is collected from a moving or adjustable position source. Spherical mirror 320 typically has a thickness of 2–3 μm or from 5–10 μm if using a silicon on insulator device layer.

The fill-factor of spherical mirror 320 and the reflectivity may be increased by inserting webbing (not shown) between petals 321 of spherical mirror 320 in an embodiment in accordance with the invention. Dielectric or metal layers with no built in stress are deposited prior to deposition of stress gradient layer 110 and patterned using standard lithographic techniques. The dielectric or metal layers are then dry or wet etched to define shape. The webbing layer is released simultaneously with metal pattern 310 of stress gradient layer 110 and deformed into a spherical shape by the stress relaxation of metal pattern 310 on release.

Figure 4:
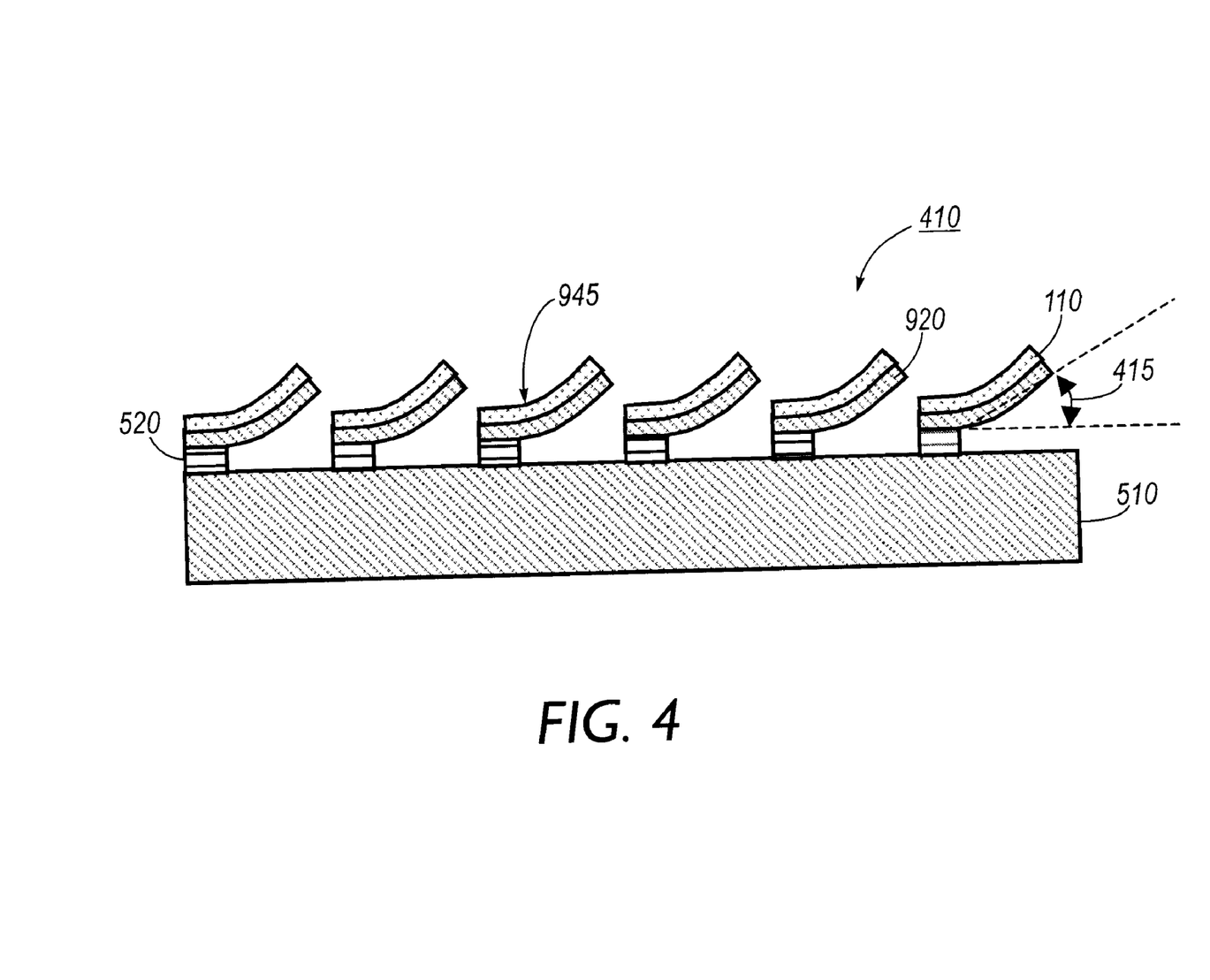
FIG. 4 shows an embodiment of a MEMS blaze grating in accordance with the invention.

MEMS tunable blazed gratings have applications for spectrophotometers. FIG. 4a shows tunable blazed grating membrane structure 410 in accordance with an embodiment of the invention. Stress gradient layer 110 typically 500–1000 nm thick is deposited on amorphous silicon or polysilicon layer 920 which is deposited on substrate 510. After release of patterned amorphous silicon or polysilicon layer 920, layer 920 is curled up due to the stress in stress gradient layer 110 to form blazed grating membrane structure 410. Blaze angle 415 is adjustable by applying a bias voltage greater than about 100 volts across substrate 510 and each blazed grating membrane 945. Each blazed grating membrane curls up on release by removal of dielectric layer 520 in a timed etchant, for example 49% hydrofluoric acid.

Equation (1) is the grating equation:

$$a \sin \theta_m = m\lambda \tag{1}$$

where a is the grating pitch, and light is assumed to be normally incident to the grating. In an embodiment in accordance with the invention, for example, taking a=3 μm and λ=670 nm results in first order diffraction angle $\theta_1$=12.9° and second order diffraction angle $\theta_2$=26.5°. With blaze angle 415 adjusted to equal to 13.25°, the specular reflection of the blaze matches the positive second order of diffraction. Adjusting blaze angle 415 to 6.45°, the specular reflection matches the first order of diffraction.

Figure 5A:
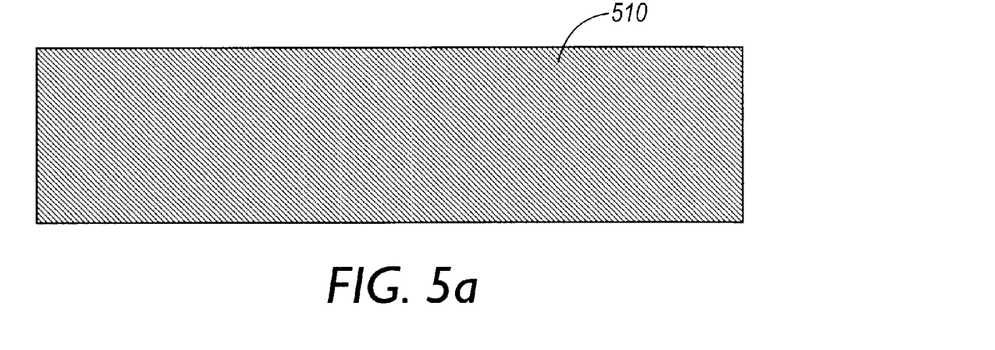
FIGS. 5a–5f show the steps for making an embodiment of a cylindrical MEMS mirror in accordance with the invention.
Figure 5B:
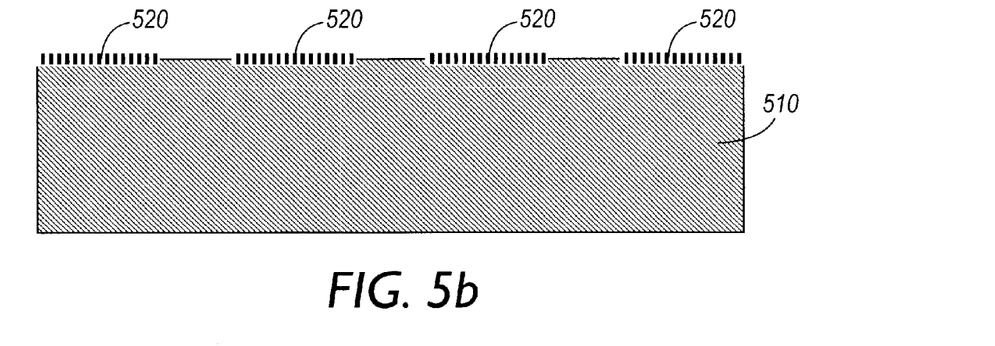
Figure 5C:
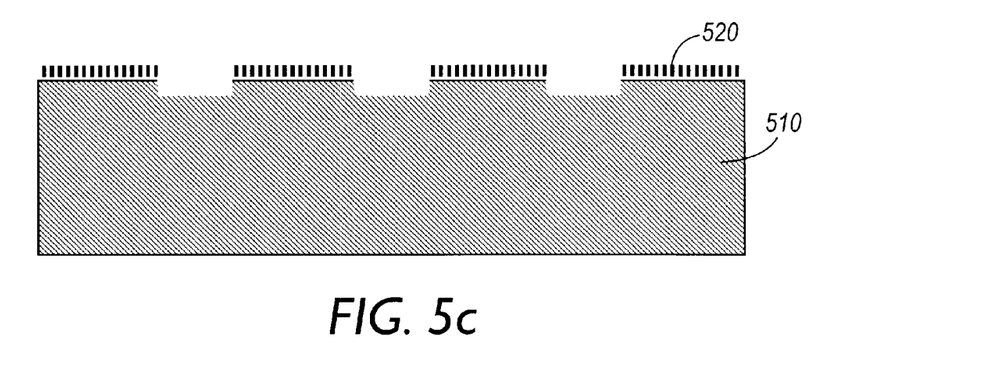
Figure 5D:
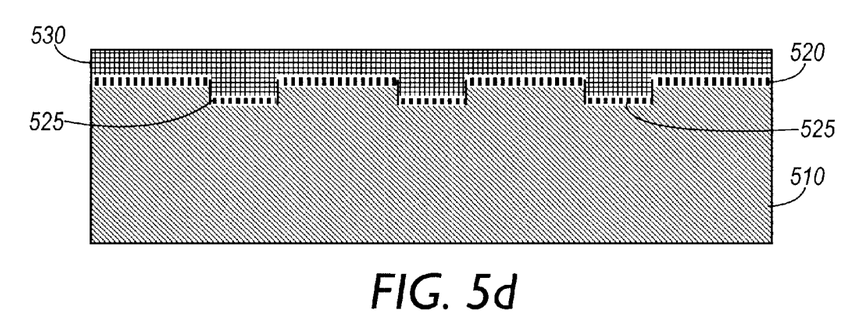
Figure 5E:
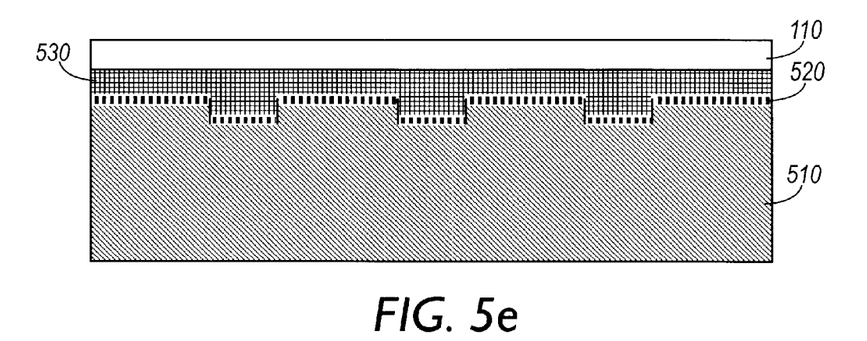
Figure 5F:
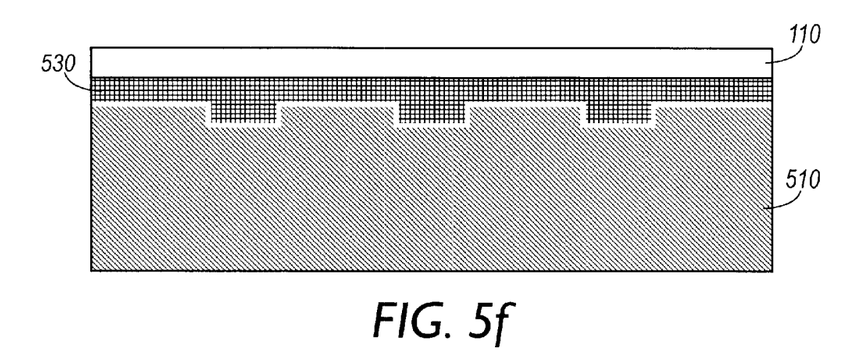
Figure 6A:
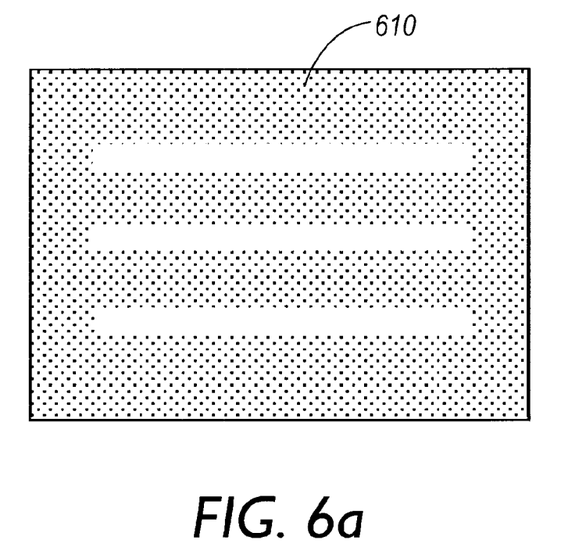
FIG. 6a shows the mask used in the step shown in FIG. 5b.
Figure 6B:
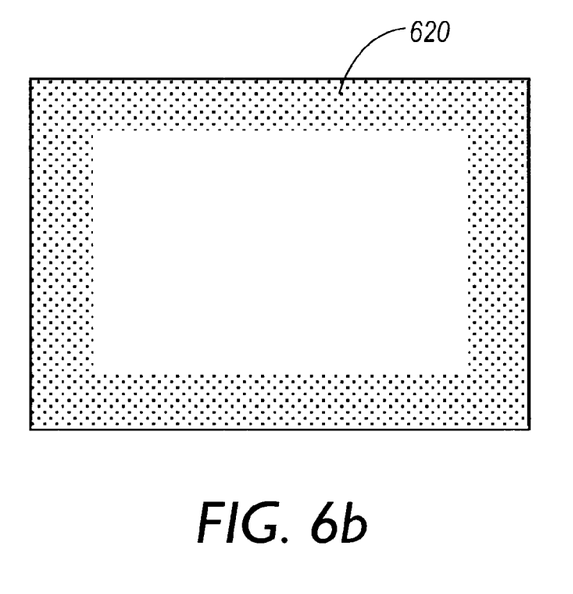
FIG. 6b shows the lift-off mask put down in the step shown in FIG. 5d

FIGS. 5a–5f show the steps for fabrication of cylindrical mirror 100 in accordance with an embodiment of the invention. FIG. 5a shows bulk silicon substrate 510. FIG. 5b shows deposition, typically by either sputtering or plasma enhanced chemical vapor deposition (PECVD) and patterning of sacrificial layer 520 on silicon substrate 510. A typical composition for sacrificial layer 520 is $SiO_2$, although other materials such as $Si_3N_4$ may be used if silicon on insulator is not used for bulk silicon substrate 510. Mask 610 is placed over sacrificial layer 520 for creation of reinforcing beams 130. FIG. 5c shows silicon substrate 510 after etching with a 45% KOH (potassium hydroxide) solution. FIG. 5d shows deposition of sacrificial layer 525 and polysilicon layer 530. Lift-off mask 620 shown in FIG. 6b is placed over polysilicon layer 530. The open center of lift-off mask 620 indicates where stress gradient layer 110, for example, a MoCr layer, is left on silicon substrate 510 when lift-off mask 620 is removed. FIG. 5e shows deposition of MoCr layer 110 as described in Table 1 above. Finally, FIG. 5f shows release of layer 530 using a 49% HF (hydrofluoric acid) wet etch to remove $SiO_2$ sacrificial layers 520 and 525. Release of layer 530 results in release of cylindrical mirror 100.

Figure 7A:
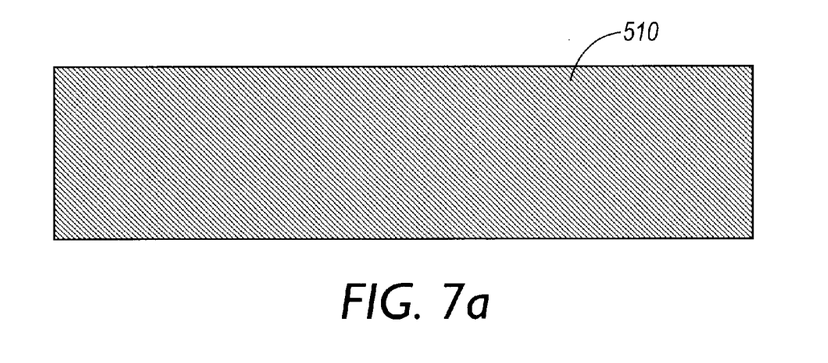
FIGS. 7a–7e show the steps for making an embodiment of a spherical MEMS mirror in accordance with the invention.
Figure 7B:
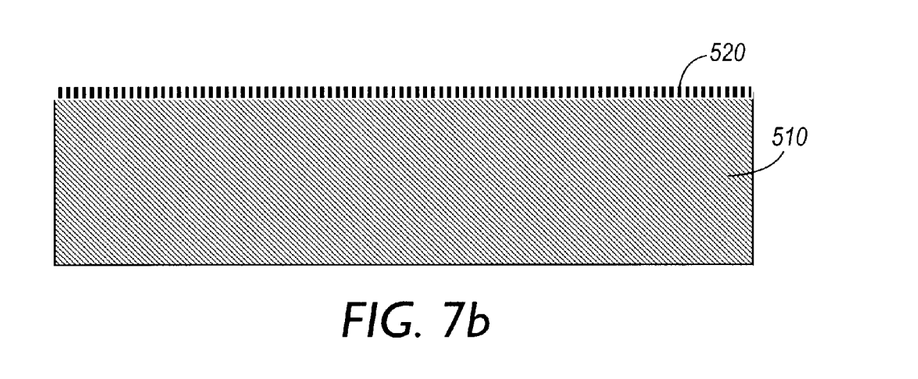
Figure 7C:
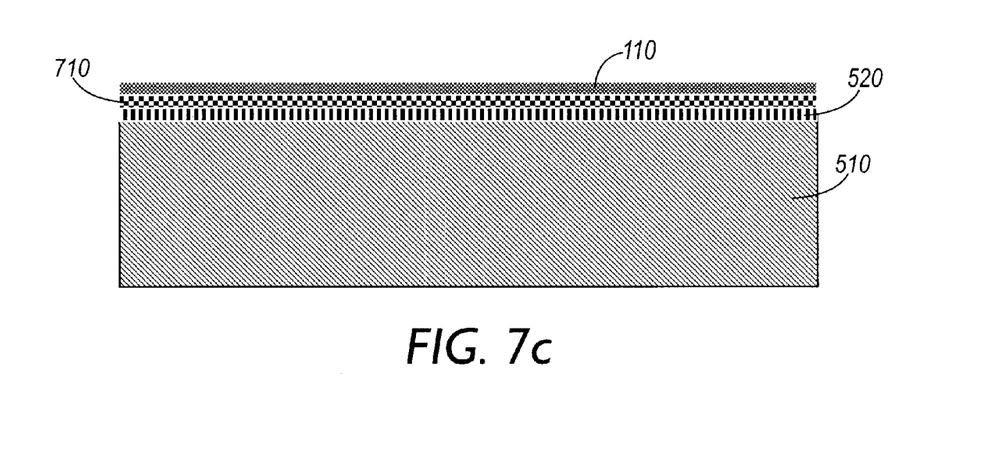
Figure 7D:
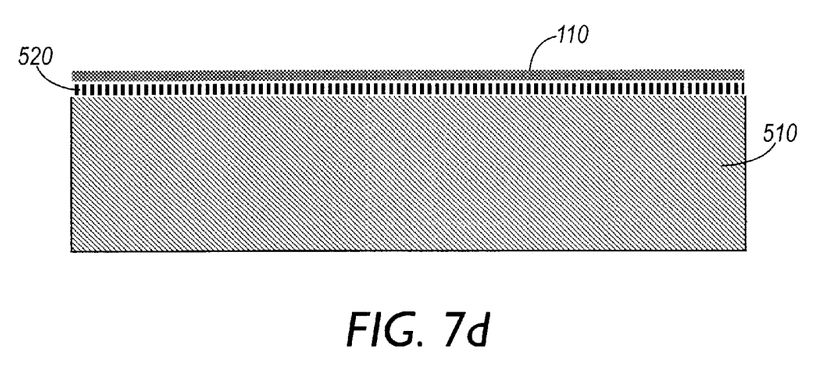
Figure 7E:
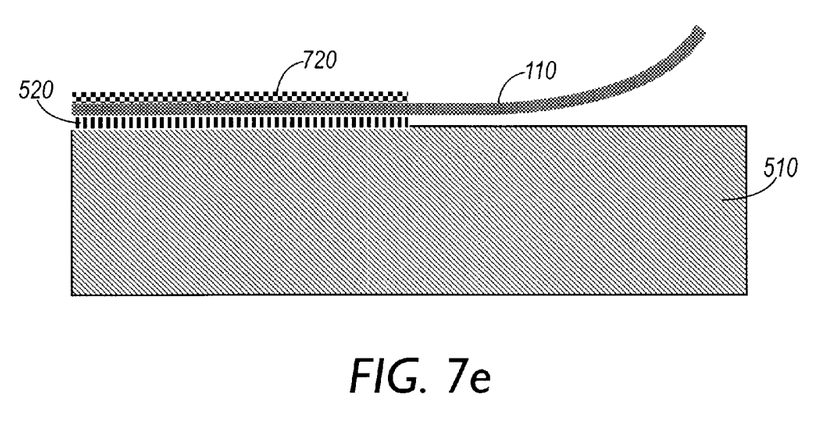
Figure 8A:
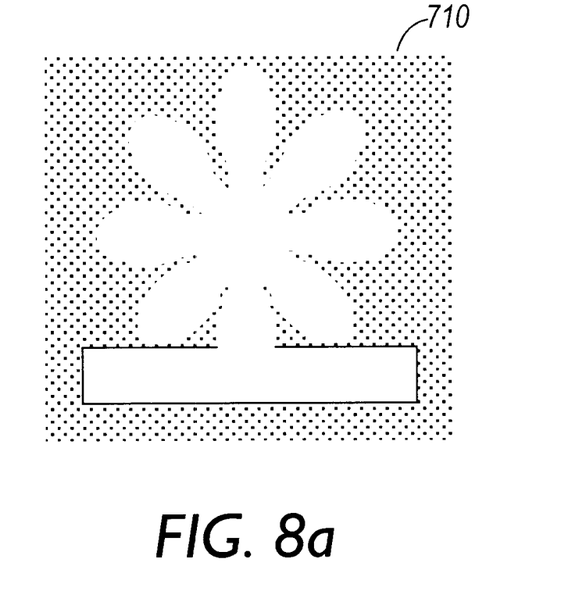
FIG. 8a shows the lift-off mask put down in the step shown in FIG. 7b.
Figure 8B:
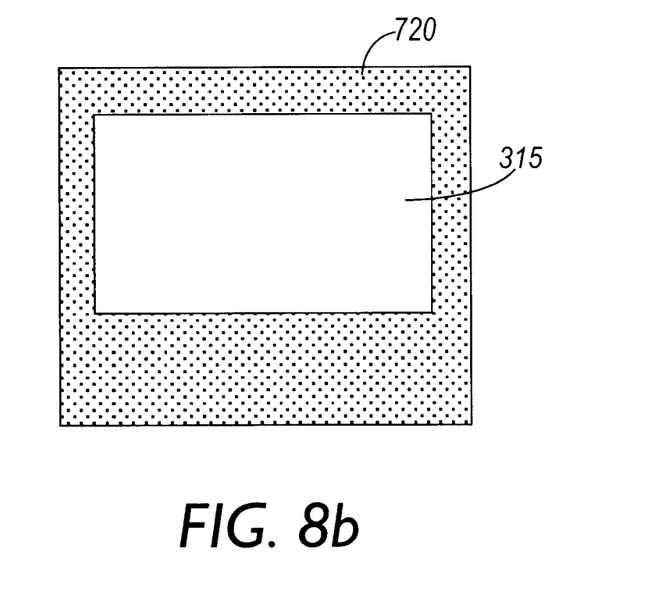
FIG. 8b shows the lift-off mask put down in the step shown in FIG. 7d.

FIGS. 7a–7e show the steps for fabrication of spherical mirror 320 in accordance with an embodiment of the invention. FIG. 7a shows bulk silicon substrate 510. Sacrificial layer 520, typically $SiO_2$, is deposited on silicon substrate 510 as shown in FIG. 7b. Photoresist lift-off mask 710 is shown in top view in FIG. 8a. Silicon substrate 510 is patterned using photoresist lift-off mask 710 followed by deposition of stress gradient layer 110, typically MoCr as described in Table 1, shown in FIG. 7c. Subsequently, lift-off mask 710 is removed along with excess MoCr associated with stress gradient layer 110 in an acetone soak lift-off process. Finally, photoresist mask 720, shown in top view in FIG. 8b, is deposited on stress gradient layer 110 using spin-on techniques to cover the sections of stress gradient layer 110 not to be released. Exposed regions of stress gradient layer 110 are released using a 49% HF (hydrofluoric acid) wet etch for sacrificial layer 520 removal. Duration of the HF etch is typically about 15 minutes for release of spherical mirror structure 320. Photoresist mask 720 allows petals 321 of spherical mirror 320 to be underetched while the remainder of spherical mirror structure 320 is protected from etching. As noted above, the efficiency of spherical mirror 320 may be enhanced by introducing webbing material between petals 321.

Figure 9A:
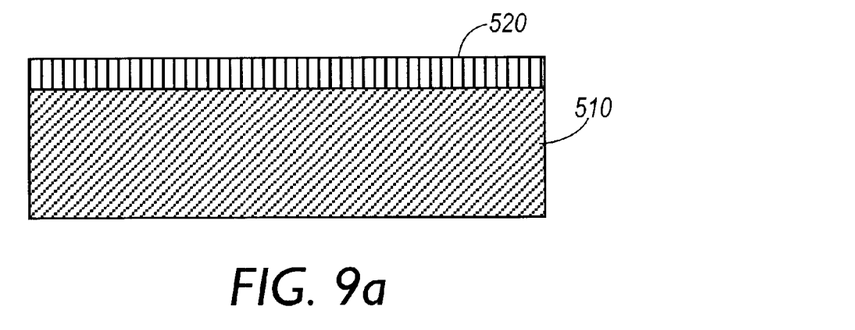
FIGS. 9a–9f show the steps for making an embodiment of a MEMS blazed grating in accordance with the invention.
Figure 9B:
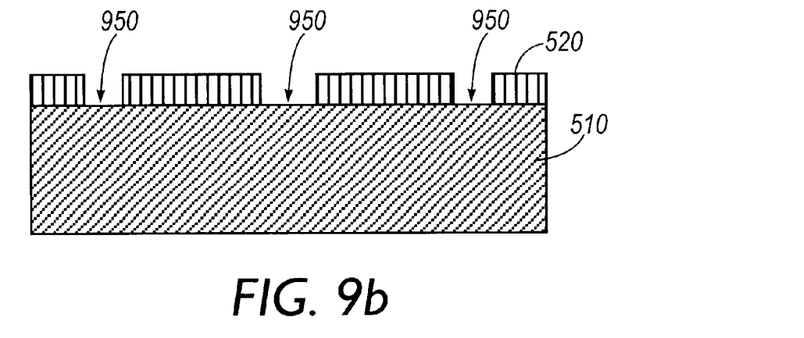
Figure 9C:
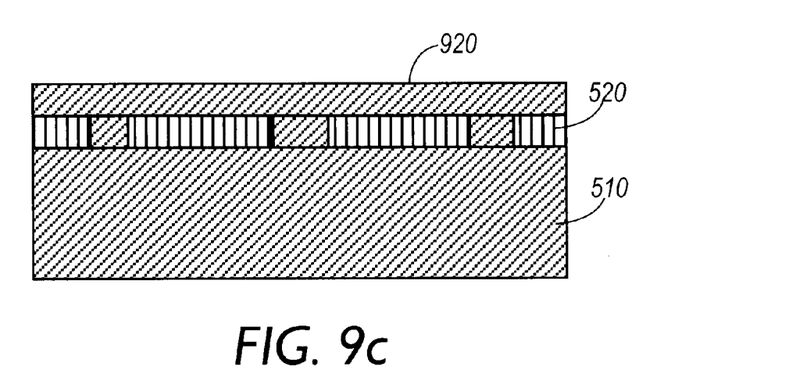
Figure 9D:
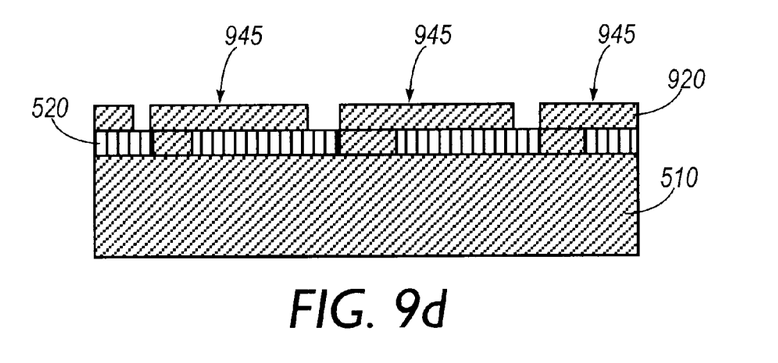
Figure 9E:
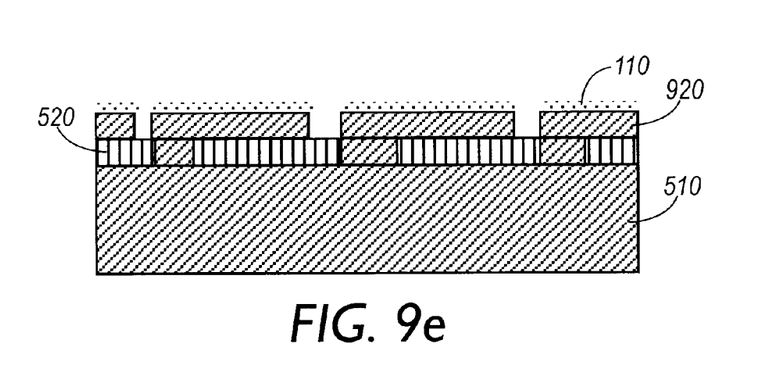
Figure 9F:
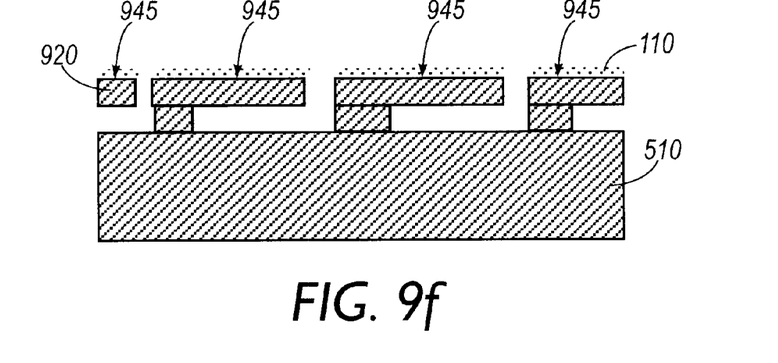
Figure 10:
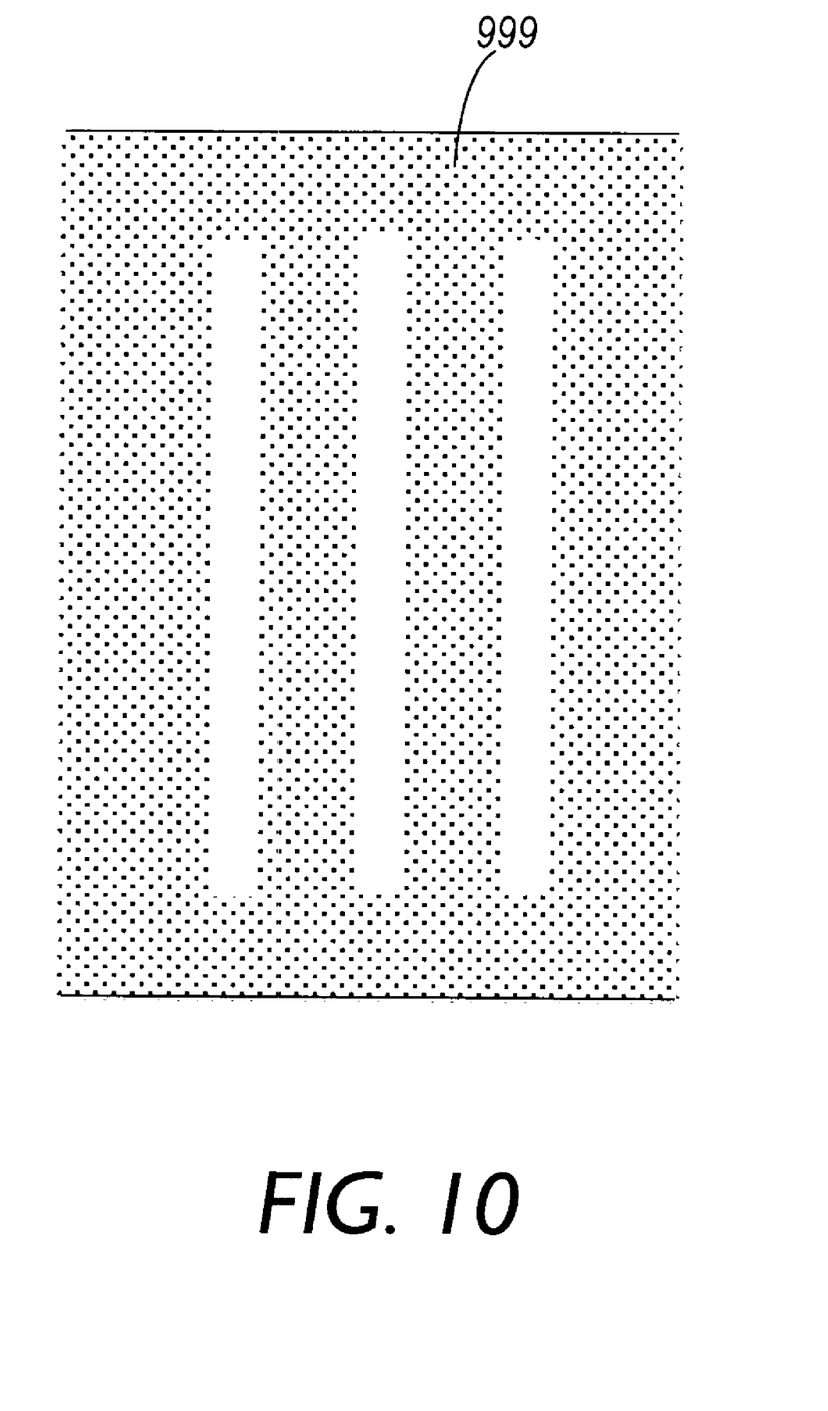
FIG. 10 shows the lift-off mask put down in the step shown in FIG. 9d.

FIGS. 9a–9f show the steps for fabrication of tunable blazed grating membrane structure 410 in accordance with an embodiment of the invention. Sacrificial layer 520 is deposited on glass or bulk silicon substrate 510 to a thickness of about 5 μm as shown in FIG. 9a. Sacrificial layer 520 is typically $SiO_2$ but sacrificial layer 520 may also be silicon nitride ($Si_3N_4$) or silicon-oxynitride ($SiON_x$), for example. Sacrificial layer 520 is patterned using standard lithography as shown in FIG. 9b with mask 999 (see FIG. 10) to expose anchor positions 950 for each individual grating 988. Polysilicon or amorphous silicon layer 920 is deposited using chemical vapor deposition over sacrificial layer 520 as shown in FIG. 9c. Polysilicon or amorphous silicon layer 920 functions as the mechanical support layer for individual grating membranes 945. Layer 920 is patterned using mask 999 shown in FIG. 10 with the exposed portions being dry etched to expose sections of sacrificial layer 520 and defining individual grating membranes 945 in polysilicon layer 920 as shown in FIG. 9d. Layer 920 is again patterned using standard lithography for a MoCr lift-off process. As shown in FIG. 9e, MoCr layer 110 is deposited using the process described in table 1 with excess resist being removed in the lift-off process which leaves MoCr layer 110 only on the tops of individual gratings 988. Sacrificial layer 520 is removed using a wet etchant, typically 49% hydrofluoric acid. As FIG. 9f shows, individual grating membranes 945, typically having a length of 100 μm, are left anchored to substrate 510 and grating membranes 945 curl up as shown in FIG. 4.

Figure 11A:
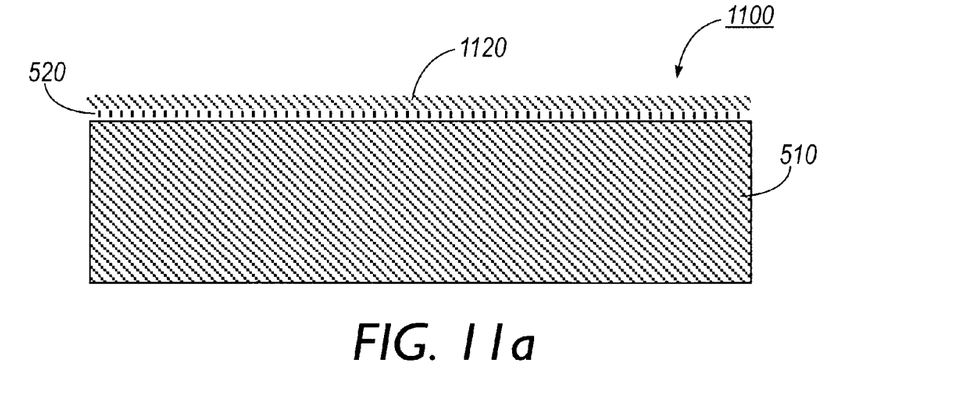
FIGS. 11a–11e shows the steps for fabrication of a spherical mirror in accordance with one embodiment of the invention.
Figure 11B:
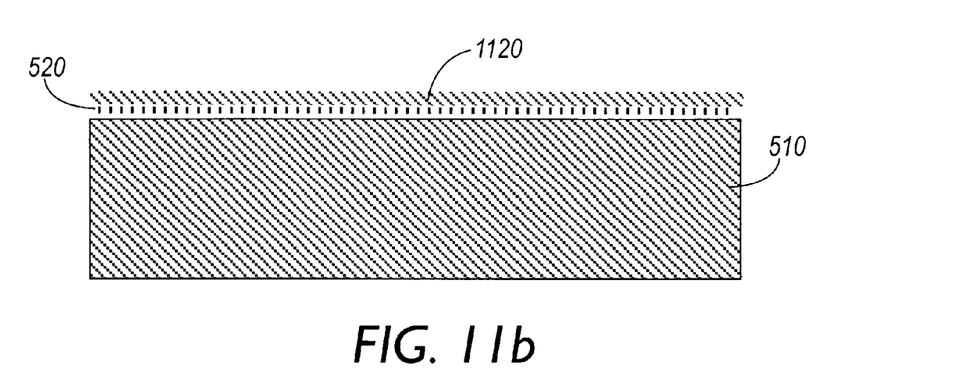
Figure 11C:
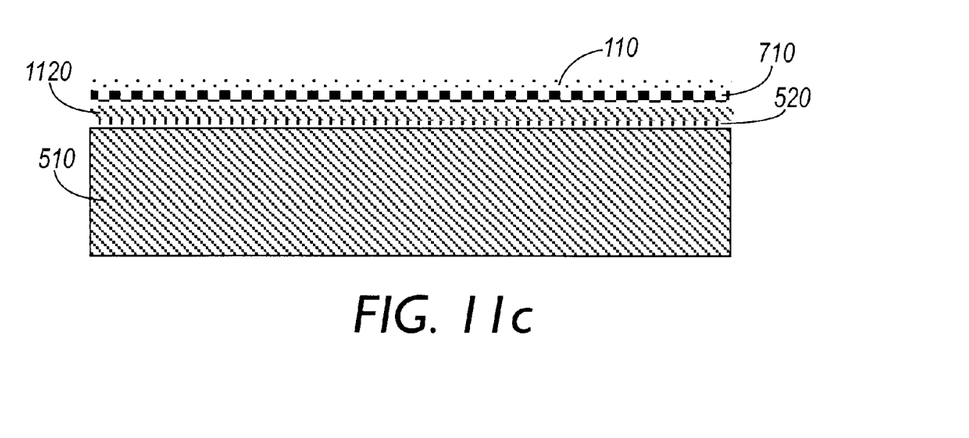
Figure 11D:
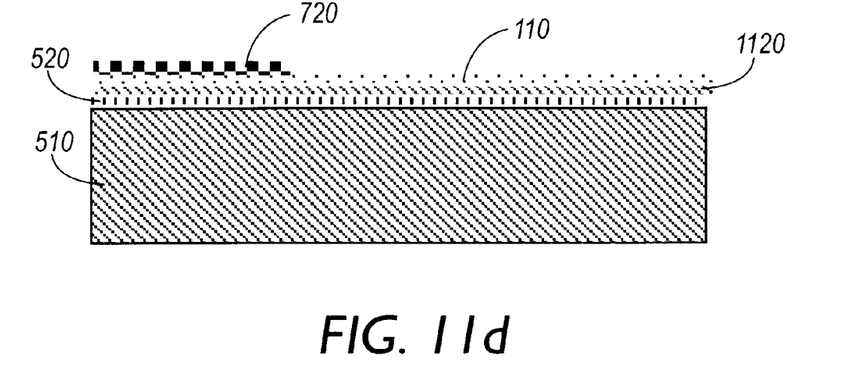
Figure 11E:
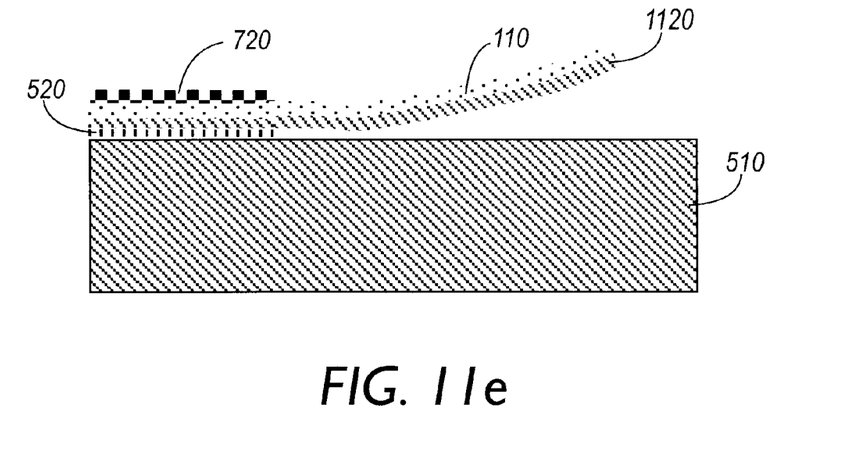

FIGS. 11a–11e show the steps for fabrication of spherical mirror 320 in accordance with an embodiment of the invention. FIG. 11 a shows silicon on insulator wafer (SOI) 1100 with single crystal silicon (SCS) layer 1120 as the fabrication starting point. As noted earlier, SOI wafer 1100 may be substituted for silicon substrate 510 in accordance with the invention. Use of commercially available SOI wafers 1100 reduces the number of processing steps and provides SCS layer 1120 which provides higher optical and mechanical quality than polysilicon material. Single crystal silicon (SCS) layer 1120 is typically 100 nm thick with sacrificial layer 520 typically having a thickness of 2 μm. FIG. 11b shows lithographic patterning using the photographic negative of mask 710 (see FIG. 8a) and etching (etchant??) of SCS layer 1120. Following etching of SCS layer 1120, photoresist mask 710 (see FIG. 8a) is put over SCS layer 1120 as shown in FIG. 11c and stress gradient layer 110 is deposited as described in Table 1. Unwanted portions of stress gradient layer 110 are then removed in a lift-off process using acetone solvent. Finally, photoresist mask 720, shown in top view in FIG. 8b, is put on stress gradient layer 110 using spin-on techniques to cover the sections of stress gradient layer 110 not to be released as shown in FIG. 11d. Exposed regions of stress gradient layer 110 are released using a 49% HF (hydrofluoric acid) wet etch for sacrificial layer 520 removal as shown in FIG. 11e. Duration of the HF etch is typically about 15 minutes for release of spherical mirror structure 320. Photoresist mask 720 allows petals 321 (see FIG. 3b) of spherical mirror 320 to be underetched while the remainder of spherical mirror structure 320 is protected from etching. Again, the efficiency of spherical mirror 320 may be enhanced by introducing webbing material between petals 321 as described above.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A method for making a shaped optical MEMS component with stressed thin films comprising:
   providing a substrate having a face;
   depositing a sacrificial layer on said face;
   placing a lift-off mask over said sacrificial layer to define said optical MEMS component;
   depositing a metal alloy stress gradient layer over said sacrificial layer;
   removing said lift-off mask and portions of said stress gradient layer residing on said lift-off mask; and,
   releasing said stress gradient layer from said sacrificial layer to make said optical MEMS component.

2. The method of claim 1 wherein said shaped optical MEMS component is a MEMS spherical mirror.

3. The method of claim 1 wherein said shaped optical MEMS component is a MEMS cylindrical mirror.

4. The method of claim 1 wherein the depositing of the metal alloy stress gradient layer further comprises the operation of:
   depositing multiple layers to form the metal alloy stress gradient layer, each layer having a different inherent stress.

5. The method of claim 1 wherein the metal alloy stress gradient layer includes MoCr material.

6. The method of claim 4 wherein the different inherent stress in each layer is induced by depositing each layer at a different pressure.

7. The method of claim 6 wherein the pressure increases with each layer of the metal alloys stress gradient layer that is deposited.

8. The method of claim 1 wherein a sputtering process is used to deposit each layer in the metal alloy stress gradient layer.

9. A method for making a shaped optical MEMS component with stressed thin films comprising:
   providing a substrate having a face;
   depositing a sacrificial layer on said face;
   placing a lift off mask over said sacrificial layer to define said optical MEMS component;
   depositing a metal alloy stress gradient layer over said sacrificial layer;
   removing said lift-off mask; and,
   releasing said stress gradient layer from said sacrificial layer to make said optical MEMS component.

10. The method of claim 9 wherein the pressure is altered during the sputtering process to induce different stresses in different layers of the stress gradient layer.

* * * * *